United States Patent [19]

Lockwood

[11] 3,982,140

[45] Sept. 21, 1976

[54] HIGH SPEED BISTABLE MULTIVIBRATOR CIRCUIT

[75] Inventor: George C. Lockwood, Dayton, Ohio

[73] Assignee: NCR Corporation, Dayton, Ohio

[22] Filed: May 9, 1975

[21] Appl. No.: 575,913

[52] U.S. Cl. .......................... 307/279; 307/235 F; 307/235 H; 307/DIG. 3

[51] Int. Cl.[2] ................. H03K 3/286; H03K 3/353; H03K 5/20

[58] Field of Search .......... 307/279, 289, 238, 291, 307/DIG. 3, 221 D, 235 F, 235 H

[56] References Cited

UNITED STATES PATENTS

| | | | |
|---|---|---|---|
| 3,868,656 | 2/1975 | Stein et al. | 307/279 X |
| 3,892,984 | 7/1975 | Stein | 307/279 |

OTHER PUBLICATIONS

Critchlow, "Sense Amplifier for IGFET Memory," vol. 13, No. 6, pp. 1720–1722; 11/1970, *IBM Tech. Discl. Bull.*

*Primary Examiner*—John S. Heyman
*Assistant Examiner*—Larry N. Anagnos
*Attorney, Agent, or Firm*—J. T. Cavender; Lawrence P. Benjamin

[57] ABSTRACT

A high speed field-effect transistor (FET) bistable multivibrator circuit is described. This bistable circuit employs two stable states and comprises a first section and a second section. Each section comprises a load transistor of high resistance magnitude for insuring a high gain; input means for storing a voltage representation of the input signal applied to that section; switching means responsive to the voltage stored in the input means for turning on one of the switching transistors; and cross-coupling and driving means, responsive to the switching transistor which turns on, for discharging the voltage representation of the input signal applied to the switching transistor in the opposite section.

12 Claims, 2 Drawing Figures

HIGH SPEED BISTABLE MULTIVIBRATOR CIRCUIT

BACKGROUND OF THE INVENTION

The present invention relates to bistable circuits, and more particularly, it relates to high gain enhancement mode field-effect transistor (FET) bistable multivibrator circuits.

While there are many forms of bistable circuits existing in the prior art, there are none which are as well adapted for a double ended mode of operation as that of the present invention. A double ended mode of operation means that the bistable circuit is responsive to an input signal on each of its sections and makes a decision as to which of the input signals is greater based on a small voltage difference existing between the two signals.

Most prior art bistable circuits respond to a single ended decision making process that one signal is greater than the opposite signal. In a single ended process, the input signal having the greater voltage level is normally the one that is turned on. Such a single ended mode of operation is best adapted for operation where the voltage difference between the two input signals is large. It is not so well adapted to make a decision where the voltage difference is rather small.

Accordingly, in the present invention the input signals to the bistable multivibrator are compared and their voltage difference is used to dynamically drive each of the two sides of the bistable multivibrator into conduction to indicate which of the input signals is larger than the other. In doing this, a unique cross-coupling and driving approach is beneficial in achieving a degree of discrimination between the input signals heretofore not possible in the prior art.

SUMMARY OF THE INVENTION

An object of the present invention is to provide a high gain FET bistable circuit which is capable of discriminating between two input signals having a very small difference therebetween.

A further object of the present invention is to provide a high gain FET bistable circuit having a dynamic cross-coupling circuit for increasing the discrimination range between pairs of incoming signals.

A still further object of the present invention is to provide a double ended high gain FET bistable circuit responsive to pairs of input signals for determining which of the two applied input signals is larger than the other.

Another object of the present invention is to provide a bistable circuit having two distinct phases of operation for determining the difference between applied pairs of input signals; wherein during phase one of operation the bistable circuit is dynamically charged to represent each of the applied input signals, and during phase two of operation the bistable circuit is latched into either of its two stable states depending upon the difference between the pair of applied signals.

These and other objects and features of this invention will become fully apparent upon reading the following description of the preferred embodiment of the invention, as illustrated by the accompanying drawings.

BRIEF DESCRIPTION OF THE INVENTION

A high gain enhancement mode field-effect transistor (FET) bistable circuit having two stable states is described. The mode of operation of such a bistable multivibrator is divided into two phases. A first phase dynamically sets up, at appropriate nodes within the circuit, voltage levels representing each of two applied signals. A second phase is an execute phase wherein the bistable multivibrator latches up in either of the two stable states depending upon the voltages established during the first phase of operation. The high gain bistable multivibrator comprises two sections. Each section includes a load transistor, a switching transistor, input means including an input transistor and a cross-coupling and driving transistor. The load transistor has a high value of resistance for achieving high gain for the circuit. Input means, including a capacitive element, is provided which is employed for storing a voltage representation of the input signal applied to that section. The switching transistor turns on when the voltage representation of an input signal exceeds its threshold voltage level. The dynamic cross-coupling means is responsive to the switching transistor in the same section for discharging the voltage on the input means in the opposite section, thereby preventing the switching transistor in the opposite section from turning on.

The mode of operation for this bistable multivibrator includes a set-up period, wherein the voltage level of the two input signals are stored on the gate capacitors of the switching transistors in each side of the bistable multivibrator.

During the decision making period of the multivibrator cycle which follows the set-up period, a first capacitor storing the greater voltage signal causes its associated switching transistor to conduct. This conduction of one switching transistor causes at least two functions. First, the conducting switching transistor establishes an output signal for identifying that stable state in which the bistable multivibrator is latched. The second function performed by the conducting switching transistor is to turn on its corresponding cross-coupling and driving transistor for discharging a second capacitor in the opposite half of the bistable multivibrator. The discharging of the second capacitor insures that the opposite side remains off.

The voltage discrimination capability of the instant bistable multivibrator is improved by employing active input driving means for charging the capacitive means in each side of the bistable multivibrator. These input means are under the control of the set-up enabling signal and therefore are only activated during the set-up cycle. During the decision making cycle, the input means isolates the bistable multivibrator from any voltage signal which is applied to the input means.

DETAILED DESCRIPTION OF THE INVENTION

Figure 1:
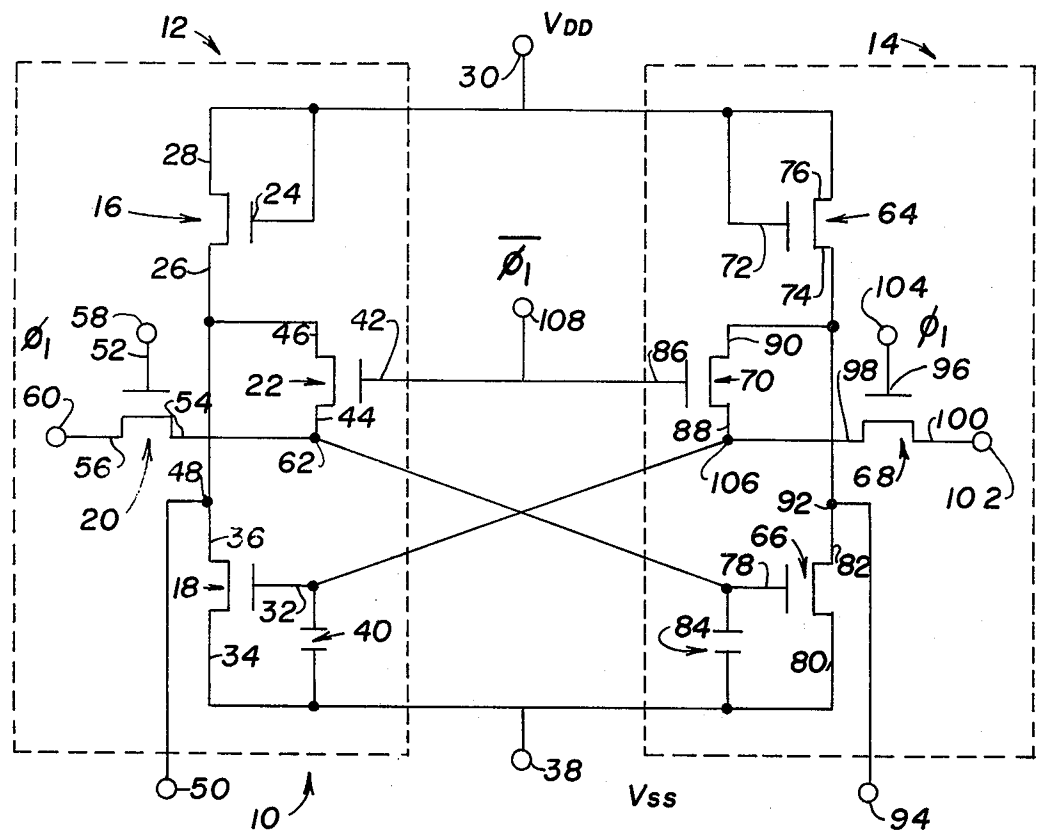
FIG. 1 is a schematic view of the high gain bistable multivibrator.

Referring to FIG. 1 there can be seen a schematic diagram of a high gain bistable multivibrator generally indicated at 10. The bistable multivibrator is divided into a first section 12 and a second section 14. The first section 12 comprises a plurality of transistors including a load transistor 16, a switching transistor 18, an input transistor 20 and a cross-coupling and driving transistor 22.

The load transistor 16 employs gate, source and drain electrodes 24, 26 and 28, respectively. The gate electrode 24 of the transistor 16 is connected to the drain electrode 28 of the same transistor and both of the last mentioned electrodes are connected to a voltage terminal 30 representing the $V_{DD}$ negative power supply. In the preferred embodiment, the negative power supply voltage level at terminal 30 is a −24 volt level.

The switching transistor 18 comprises gate, source and drain electrodes 32, 34 and 36, respectively. The source electrode 34 is connected to a second power supply terminal 38 which represents the $V_{SS}$ signal level. In the preferred embodiment the $V_{SS}$ terminal is at ground potential. A capacitor 40 is shown connected between the gate electrode 32 ad the VSS terminal 38. This capacitor 40 represents either the gate capacitance of the transistor 18 and/or an individual capacitive element.

The cross-coupling and driving transistor 22 employs gate, source and drain electrodes 42, 44 and 46, respectively. The drain electrode of the transistor 22 is connected to the source electrode 26 of the transistor 16 and both of these last mentioned electrodes are further connected to the drain electrode 36 of the transistor 18 at a junction 48. The junction 48 is connected to a first output terminal 50.

The input transistor 20 employs gate, source and drain electrodes 52, 54 and 56, respectively. The gate electrode is connected to a phase 1 ($\phi_1$) input terminal 58 which is an enabling control signal present during the setup portion of the bistable multivibrator cycle of operation. The drain electrode 56 is connected to a first input terminal 60 at which one of the two input signals to be compared is available. The source electrode 54 of the transistor 20 is connected to the source electrode 44 of the transistor 22 and forms a junction 62.

The second section of the bistable circuit 10 employs a load transistor 64, a switching transistor 66, an input transistor 68 and a cross-coupling and driving transistor 70.

The load transistor 64 employs gate, source and drain electrodes 72, 74 and 76, respectively. The gate electrode 72 of the transistor 64 is connected to the drain electrode 76 of the same transistor and both of the last mentioned electrodes are connected to the $V_{DD}$ power supply terminal 30.

The switching transistor 66 comprises gate, source and drain electrodes 78, 80 and 82, respectively. The source electrode 80 is connected to the $V_{SS}$ power supply terminal 38. A capacitor 84 is connected between the gate electrode 78 of the transistor 66 and the $V_{SS}$ terminal 38. The capacitor 84 represents either the gate capacitance of the transistor 66 and/or an individual capacitive element.

The cross-coupling and driving transistor 70 comprises gate, source and drain electrodes 86, 88 and 90, respectively. The drain electrode 90 of the transistor 70 is connected to the source electrode 74 of the transistor 64 and both of the last mentioned electrodes are connected to the drain electrode 82 of the transistor 66 at a junction 92. The junction 92 is the output junction of the section 14 of the bistable multivibrator. The junction 92 is connected to a second output terminal at 94.

The input transistor 68 comprises gate, source and drain electrodes 96, 98 and 100, respectively. The drain electrode 100 is connected to an input terminal 102 at which the second input signal is applied. The gate electrode 96 is connected to the phase 1 ($\phi_1$) input terminal 104 for receiving the phase 1 ($\phi_1$) enabling signal during the set-up portion of the bistable circuit operating cycle. The source electrode 98 is connected to the source electrode 88 of the transistor 70 at a junction 106.

The junction 62 of the lefthand section 12 of the bistable multivibrator is connected to the junction of the gate electrode 78 of the transistor 66 and one side of the capacitor 84. The junction 106 is connected to the gate electrode 32 of the transistor 18 and to the one side of the capacitor 40.

The gate electrode 42 of the transistor 22 is connected to the gate electrode 86 of the transistor 70 and both of these last mentioned electrodes are connected to the $\overline{\text{phase 1}}$ ($\overline{\phi_1}$) input terminal at 108. The $\overline{\text{phase 1}}$ ($\overline{\phi_1}$) input signal is the enabling signal during the latching portion of the operating cycle of the bistable multivibrator.

Figure 2:
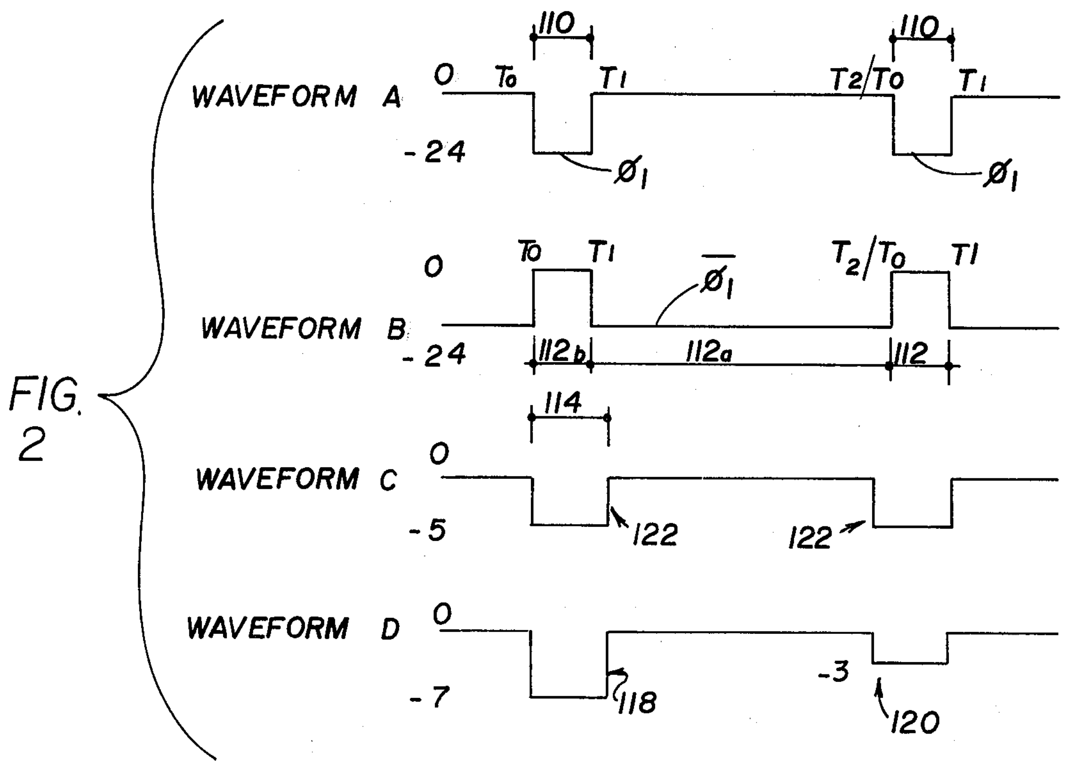
FIG. 2 illustrates four waveforms representing input signals used in the circuit of FIG. 1.

Referrence to FIG. 2, waveform A shows the phase 1 ($\phi_1$) enabling signal available at terminals 58 and 104. Waveform B shows the enabling signal available at the $\overline{\text{phase 1}}$ ($\overline{\phi_1}$) enabling terminal 108. Referring specifically to waveform A, the phase 1 enabling portion time period is represented by a line 110 and exists between times $T_0$ and $T_1$. The $\overline{\text{phase 1}}$ ($\overline{\phi_1}$) enabling portion time period is represented by a line 112*a* of waveform B. The enabling signal for $\overline{\text{phase 1}}$ is available between times $T_1$ to $T_2$ of the bistable multivibrator cycle. At time $T_2$, the cycle begins over again and this is indicated by identifying that moment in time as the end of the first cycle by calling it $T_2$ and identifying the same moment in time as the beginning of the next cycle and calling it $T_0$.

Referring again to FIG. 1, the mode of operation of the high gain FET bistable multivibrator is explained. First of all, the capacitors 40 and 84 in the preferred embodiment are the gate capacitances of the gate electrodes 32 and 78, respectively. These capacitors 40 and 84 could as well be individual components added into the circuit, if desired or needed.

Waveform C is applied to the input terminal 102 and comrpises a constant voltage level of −5 volts during time period 114 which corresponds to the set-up period indicated by the time period 110, shown in waveform A. Waveform D shown in FIG. 2 is applied to terminal 60 and comprises a two level signal. A first voltage signal of −7 volts is shown at 118 and a second less negative voltage level of −3 volts is shown at 120. For purposes of the operation of the present circuit, the voltage pulse 118 represents a binary 0 and the pulse 120 represents a binary 1. The signal shown in waveform C is a reference voltage signal 122 which occurs in coincidence with the pulses 118 and 120. The reference pulse 122, in combination with one or the other of the pulses 118 and 120, respectively causes the high gain, bistable multivibrator to have a double ended input for dynamically deciding whether or not the input pulse at terminal 60 is more negative than, or more positive than the reference pulse 122 applied to the terminal 102.

During the set-up cycle of the bistable circuit shown in FIG. 1, the enabling signal $\phi_1$ during time period 110 shown in waveform A is applied to the terminals 58 and 104 of transistors 20 and 68, respectively. This enabling signal turns on the transistors 20 and 68. At the same point in time, as seen with reference to waveforms C and D, the pulse 118 is available at terminal 60 and the pulse 122 is available at terminal 102. The reference pulse 122 charges capacitor 40 to the −5 volt level. Input pulse 118 available at terminal 60 charges capacitor 84 to the −7 volt level. This means that gate 78 of transistor 66 has a −7 volt signal applied thereto while gate 32 of transistor 18 has a −5 volt signal applied thereto. Transistors 18 and 66 do not conduct because the cross-coupling and driving transistors 22 and 70 are turned off by the disabling time period 112*b* of the phase $\overline{1}$ ($\overline{\phi_1}$) signal at terminal 108.

At time $T_1$ the enabling signal $\phi_1$ is removed from terminals 58 and 104 and a disabling signal is applied thereto, thus turning off input transistors 20 and 68 and isolating the high-gain bistable multivibrator from the input terminals 60 and 102. This isolation is an important advantage for the high-gain bistable multivibrator. When the high-gain bistable multivibrator is used in a memory system, terminals 60 and 102 are connected in the sense lines to the memory. During the period of isolation, voltage levels may be changing at the terminals 60 and 102 to set up additional information for the next sampling period. Accordingly, the isolation provided by input transistors 20 and 68 isolates the decision making portions of the high-gain bistable multivibrator from any extraneous signals occurring at the input terminals 60 and 102.

Simultaneously with the removal of the enabling signals at terminals 58 and 104, an enabling signal ($\overline{\phi_1}$) is applied to the phase $\overline{1}$ terminal 108. This provides the enabling signal $\overline{\phi_1}$ to the gates 42 and 86 of the transistors 22 and 77, respectively.

During time interval 110, capacitors 40 and 84 are charged unequally and transistors 18 and 66 may be conducting depending, in general, on whether or not the voltages at gates 32 and 78 are more negative than the threshold voltage of transistors 18 and 66, respectively. At time $T_1$, as node 108 becomes negative, transistors 22 and 70 begin to conduct (i.e., their source to drain resistance decreases) with usually high negative voltages on their drains, 46 and 90, and low input signal voltages on their sources, 44 and 88. The "loop gain" of the bistable circuit rises from zero to one and greater. As the loop gain rises above one, regeneration occurs and the bistable circuit rapidly switches into one of its two stable states, depending on the initial unbalance of charges on capacitors 40 and 84.

Following the application of pulse 118 during time period 114, the switching transistor 66 is activated more strongly than switching transistor 18 because of the more negative gate voltage (−7v) at its gate electrode 78 at the time the enabling signal at terminal 108 is available. The transistor 66 turns on and establishes the $V_{SS}$ voltage level at the drain electrode 90 of the cross-coupling and driving transistor 70 in the same side of the bistable multivibrator. Since the source electrode of the cross-coupling and driving transistor 70 is connected to the capacitor 40 in the opposite side of the bistable multivibrator, a minus five volts (−5v) is applied to the source electrode 88 and ground level ($V_{SS}$) is applied to the drain electrode of the transistor 70. This turns on the transistor 70. The turning on of the cross-coupling and driving transistor 70 discharges the voltage stored on the capacitor 40 on the opposite side of the bistable multivibrator. This discharging of the capacitor 40 on the opposite side of the bistable multivibrator keeps the opposite side turned off. The high voltage level on the switching transistor 66 continues to drive the switching transistor 66 into conduction until a $V_{SS}$ level is available at junction 92. The $V_{DD}$ level reduced by the threshold of the transistor 16 is maintained at junction 48. This represents a binary "0" stored in the bistable multivibrator. The bistable multivibrator stays in this stable state with the transistor 66 conducting and the transistor 18 off during the remaining time period of the phase $\overline{1}$ ($\overline{\phi_1}$) enabling signal indicated by the line 112*a* as shown in waveform B.

Beginning with the next cycle of operation for the bistable multivibrator which is indicated at waveforms A and B as the $T_2/T_0$ time, the phase $\overline{1}$ enabling signal is removed which removes the internal drive from the gate electrodes 32 and 78 of the transistors 18 and 66, respectively, and permits the charges on the capacitors 40 and 84 to be set by new input signals. The cycle begins over again with the application of the phase 1 enabling signal $\phi_1$ to the terminals 58 and 104 of transistors 20 and 68, respectively. At this point in time, the waveform C applies a −5 volt signal to terminal 102 and the conduction of transistor 68 charges capacitor 40 to the −5 volt level. At the same point in time, the −3 volt signal 120 from waveform D is applied to terminal 60 and the conduction of transistor 20 charges capacitor 84 to a −3 volt level.

During the remaining portion of the initializing cycle, the transistors await the decision making cycle. The decision is dynamically stored on transistors 18 and 66.

The phase 1 enabling signal at terminals 58 and 104 are removed and the phase $\overline{1}$ enabling signal is applied to terminal 108. Again, the disabling signal at terminals 58 and 104 isolate the internal decision making portion of the bistable multivibrator from the fluctuating signals available at terminals 60 and 102. Since the capacitor 40 is charged to the minus five (−5) volt level and the capacitor 84 is charged to the minus three (−3) volt level, the more negative voltage, in combination with the extremely high gain of the circuit causes transistor 18 to be activated more strongly upon the application of the phase $\overline{1}$ enabling signal to transistors 22 and 70. The conduction of transistor 18 causes junction 48 to move to the $V_{SS}$ level, thereby causing the transistor 22 to conduct and discharge capacitor 84. The discharging of capacitor 84 keeps transistor 66 off. Transistor 18 remains on during the remaining portion of the bistable multivibrator cycle. During this portion of the cycle, a $V_{SS}$ signal is available at junction 48 and a $V_{DD}$ signal is available at junction 92 for application to the output terminals 50 and 94, respectively. This state indicates that the bistable circuit stores a binary 1.

While the waveforms shown in waveforms C and D are exemplary of one type of waveform encountered, it should be borne in mind that the discrimination available from the circuit shown in FIG. 1 makes a positive decision when the difference between the signal on waveform C and the signal on waveform D has a difference of only 200 millivolts. The voltages shown are correct for P-channel devices, positive voltages should be used for N-channel circuits.

As previously pointed out the bistable circuit may be connected into a memory system or other systems wherein the input waveforms such as C and D are not in square wave pulses of a given voltage level, but are continuous varying voltages. The pulse waveform of waveforms C and D are provided by providing clock pulses to the circuits which provide waveforms C and D, which corresponds to the clock pulses which create the phase 1 and phase $\overline{1}$. When the input voltages are continuously varying, these voltages are sampled only during the shorter set-up cycle of the bistable circuit. These samples are then stored until the decision making period of the bistable circuit cycle during which time they are compared. Since the storage capacitance and the input terminals are isolated from each other during the longer decision making period, no external variations can affect the decision making capacitance of the bistable multivibrator during this period. This provides for a highly increased assurance of correct decisions.

While the invention has been shown and described with reference to a specific embodiment, it will be understood by those skilled in the art that various changes in form and details may be made therein without departing from the spirit and scope of the invention.

I claim:

1. In a bistable circuit having two symmetrical circuit sections and having a first stable state when one section is conducting and a second stable state when the other section is conducting, the improvement comprising:

a source of reference voltage, a first voltage storage means connected to said first section to cause it to initially conduct at a rate proportional to its stored voltage, means for periodically applying the reference voltage to said first voltage storage means during a first predetermined period and for isolating said source of reference voltage from said first storage means during a second predetermined period, a source of information voltage, a second voltage storage means connected to said second section to cause it to initially conduct at a rate proportional to its stored voltage, means for periodically applying the information voltage to said second storage means during said first predetermined period and for isolating said source of information voltage from said second storage means during said second predetermined period, and means for deactivating both said circuit sections during said first predetermined period and for activating said circuit sections during said second predetermined period.

2. A bistable circuit in accordance with claim 1, wherein:

said first circuit section is connected to said second storage means to discharge voltage stored therein whenever said first circuit section is activated, and said second circuit section is connected to said first storage means to discharge voltage stored therein whenever said second circuit section is activated.

3. A bistable circuit of the type having two stable states, comprising:

first input means for storing a voltage representation of a reference signal, said first input means includes a first capacitance means for storing said voltage representation of said reference signal and a first input transistor means for periodically establishing said voltage representation on said first capacitance means, second input means for storing a voltage representation of a information signal, said second input means includes a second capacitance means for storing said voltage representation of said information signal and a second input transistor means for periodically establishing said voltage representation on said second capacitance means, first switching means responsive to said voltage stored in said first capacitance means, second switching means responsive to said voltage stored in said second capacitance means, first cross-coupling and driving means responsive to said first switching means for discharging said voltage representation stored in said second input means upon the conduction of said first switching means, second cross-coupling and driving means responsive to said second switching means for discharging said voltage representation stored in said first input means, upon the conduction of said second switching means, first enabling means connected to said first input transistor means and connected to said second input transistor means for controlling the establishment of said voltage representation of said reference and information signals on said first and said second capacitance means, respectively, during a first predetermined portion of each period, and first disabling means connected to said first and second input means for turning off said input transistors and isolating them from said capacitance means during a second predetermined portion of each period.

4. A bistable circuit as recited in claim 3, wherein:

said first cross-coupling and driving means includes a first transistor having source, drain and gate electrodes, said source electrode of said first transistor being connected to said second capacitive element, said drain electrode of said first transistor being connected to said first switching means, and said gate electrode of said first transistor being connected to a first terminal, said second cross-coupling and driving means includes a second transistor having source, drain and gate electrodes, said source electrode of said second transistor being connected to said first capacitive element, said drain electrode of said second transistor being connected to said second switching means, and said gate electrode of said second transistor being connected to said first terminal.

5. A bistable circuit as recited in claim 4, and further comprising:

second disabling means connected to said first cross-coupling and driving means and connected to said second cross-coupling and driving means for inactivating said first and second cross-coupling and driving means during said first predetermined portion of each period, and second enabling means connected to said first cross-coupling and driving means and connected to said second cross-coupling and driving means for enabling said first and second cross-coupling and driving means for latching up the bistable circuit into one of its stable states during said second predetermined portion of each period.

6. A bistable circuit as recited in claim 5, wherein:

said first capacitive means is an individual capacitor, and said second capacitive means is a second individual capacitor.

7. A bistable circuit of the type having two stable states, comprising:

a first section including a first load transistor and a first switching transistor connected together at a first junction, a second section including a second load transistor and a second switching transistor connected together at a second junction, first input means connected to said first junction through a first cross-coupling and driving means for storing a voltage representation of a first input signal during a first predetermined portion of a period of time, second input means connected to said second junction through a second cross-coupling and driving means for storing a voltage representation of a second input signal during the first predetermined portion of the period of time, said first switching transistor being responsive to said voltage representation stored in said second input means, said second switching transistor being responsive to said voltage representation stored in said first input means, said first cross-coupling and driving means, during a second predetermined portion of the period of time, responsive to said first switching transistor for discharging said voltage representation stored in said first input means upon the conduction of said first switching transistor, and said second cross-coupling and driving means, during the second predetermined portion of the period of time, responsive to said second switching transistor for discharging said voltage representation stored in said first input signal means upon the conduction of said second switching means.

8. A bistable circuit as recited in claim 7, wherein:

said first input means includes a first capacitive means for storing said voltage representation of said first signal and a first transistor means for periodically establishing, during each said first periodic portion, said voltage representation on said first capacitive means, and said second input means includes a second capacitive means for storing said voltage representation of said second signal, and second transistor means for periodically selectively establishing, during each said first periodic portion, said voltage representation on said second capacitive means.

9. A bistable circuit of the type having two stable tates, comprising:

first inverter means for operating as a first half of the bistable circuit, and including a first load transistor and a first switching transistor connected together at a first junction, a second inverter means for operating as a second half of the bistable circuit, and including a second load transistor and a second switching transistor and connected together at a second junction, first input means for storing a voltage representation of a first input signal including first capacitive means and a first input transistor means connected together at a third junction, second input means for storing a voltage representation of a second input signal and including second capacitive means and a second input transistor means connected together at a fourth junction, said first switching transistor being responsive to said voltage representation of said second input signal stored on said second capacitive means for turning on said first switching transistor when said voltage signal on said second capacitive means exceeds the threshold voltage of said first switching transistor, said second switching transistor being responsive to said voltage representation of said first input signal stored on said first capacitive means for turning on said second switching transistor when said voltage signal on said first capacitive means exceeds the threshold voltage of said second switching transistor, first cross-coupling and driving means connected between said first and said third junctions and being responsive to said first switching transistor for discharging said voltage representation of said input signal stored on said first capacitive means, second cross-coupling and driving means connected between said second and said fourth junctions and being responsive to said second switching transistor for discharging said voltage representation of said input signal stored on said second capacitive means, first disabling means connected to said first and second input means for turning off said input transistors and isolating said capacitive means during a first predetermined period of time, and second disabling means connected to said first cross-coupling and driving means and connected to said second cross-coupling and driving means for inactivating said first and second cross-coupling and driving means during a second predetermined period of time.

10. A bistable circuit as recited in claim 9, and further comprising:

first enabling means connected to said first input transistor means and connected to said second input transistor means for controlling the establishment of said voltage representation of said first and said second input signals on said first and second capacitive means, respectively, during said second predetermined period of time.

11. A bistable circuit as recited in claim 10, and further comprising:

second enabling means connected to said first cross-coupling and driving means and connected to said second cross-coupling and driving means for enabling said first and second cross-coupling and driving means for latching up the bistable circuit into one of its stable states, during said first predetermined period of time.

12. A bistable circuit as recited in claim 11, wherein:

said first capacitive means is an individual MOS capacitor, and said second capacitive means is a second individual MOS capacitor.

* * * * *